United States Patent
Schulze et al.

(10) Patent No.: US 10,199,526 B2
(45) Date of Patent: Feb. 5, 2019

(54) RADIATION DETECTOR AND A METHOD FOR FORMING A SEMICONDUCTOR DEVICE

(71) Applicant: Infineon Technologies AG, Neubiberg (DE)

(72) Inventors: Hans-Joachim Schulze, Taufkirchen (DE); Johannes Hacker, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/581,549

(22) Filed: Apr. 28, 2017

(65) Prior Publication Data

US 2018/0315882 A1 Nov. 1, 2018

(51) Int. Cl.
| | |
|---|---|
| *H01L 31/115* | (2006.01) |
| *H01L 21/02* | (2006.01) |
| *H01L 31/18* | (2006.01) |
| *H01L 31/0352* | (2006.01) |
| *H01L 31/0288* | (2006.01) |
| *H01L 31/0224* | (2006.01) |

(52) U.S. Cl.
CPC ........ *H01L 31/115* (2013.01); *H01L 31/0288* (2013.01); *H01L 31/022408* (2013.01); *H01L 31/035272* (2013.01); *H01L 31/1804* (2013.01); *H01L 31/1864* (2013.01); *H01L 31/1872* (2013.01)

(58) Field of Classification Search
CPC ..... H01L 21/02; H01L 21/324; H01L 31/115; H01L 31/022408; H01L 31/0288; H01L 31/035272; H01L 31/1804; H01L 31/1864; H01L 31/1872

See application file for complete search history.

(56) References Cited

U.S. PATENT DOCUMENTS

| | | | |
|---|---|---|---|
| 7,612,344 B1 | 11/2009 | Schulze et al. | |
| 9,613,805 B1* | 4/2017 | Schustereder | .... H01L 21/02592 |
| 2002/0058366 A1* | 5/2002 | Miyasaki | ............ H01L 21/2026 438/166 |
| 2006/0073684 A1* | 4/2006 | Schulze | ................ H01L 21/263 438/514 |
| 2009/0142879 A1* | 6/2009 | Isaka | ................. H01L 31/03762 438/96 |

(Continued)

*Primary Examiner* — Fazli Erdem
(74) *Attorney, Agent, or Firm* — Murphy, Bilak & Homiller, PLLC

(57) ABSTRACT

A method for forming a semiconductor device includes forming an amorphous semiconductor layer adjacent to a lightly doped region of a semiconductor wafer. The lightly doped region forms at least part of a back side of the semiconductor wafer, and the lightly doped region has a first conductivity type. The method further includes incorporating dopants into the amorphous semiconductor layer during or after forming the amorphous semiconductor layer. The method further includes annealing the amorphous semiconductor layer to transform at least a part of the amorphous semiconductor layer into a substantially monocrystalline semiconductor layer and to form a highly doped region in the monocrystalline semiconductor layer at the back side of the semiconductor wafer. The highly doped region has the first conductivity type.

18 Claims, 10 Drawing Sheets

(56) References Cited

U.S. PATENT DOCUMENTS

2009/0267200 A1* 10/2009 Gutt ................ H01L 21/26513
                                                          257/655
2010/0240172 A1*  9/2010 Rana ................ H01L 31/03529
                                                           438/96

* cited by examiner

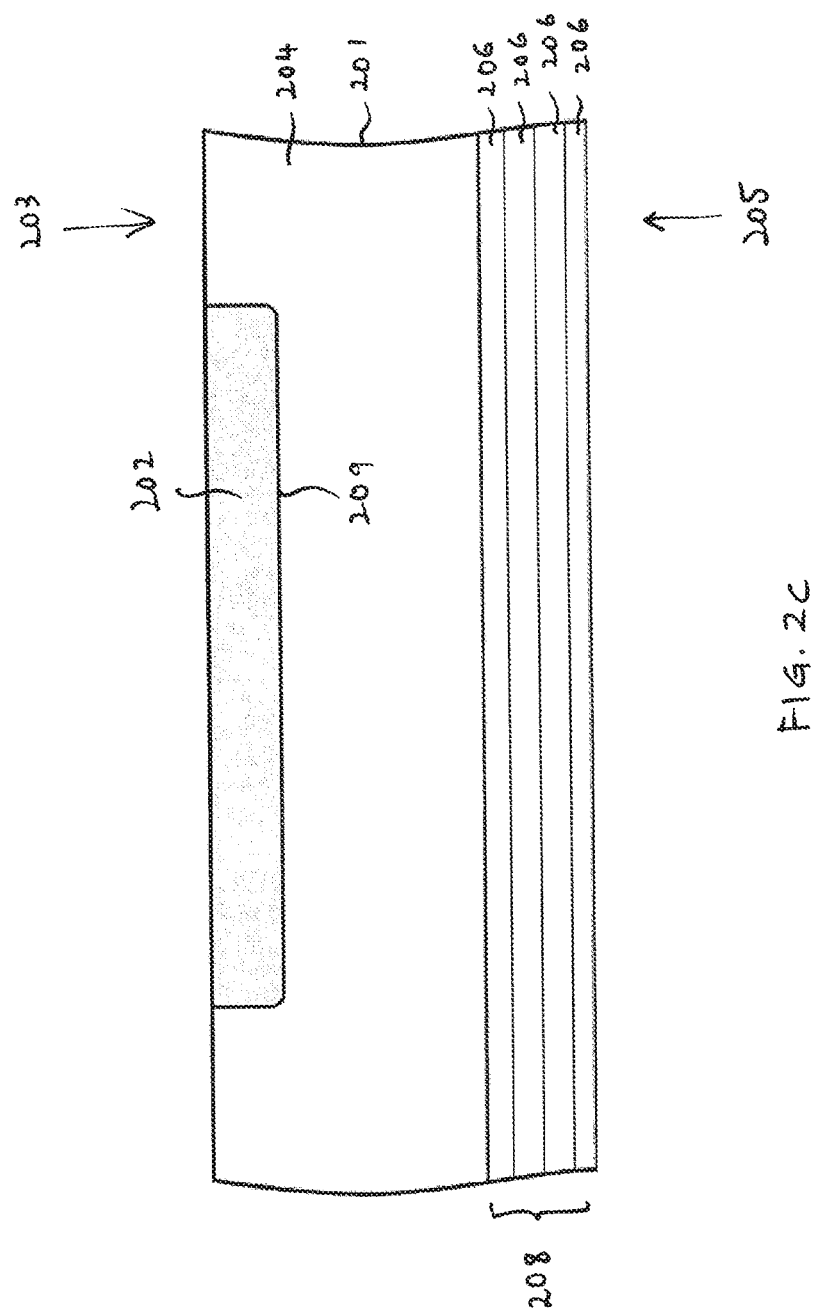

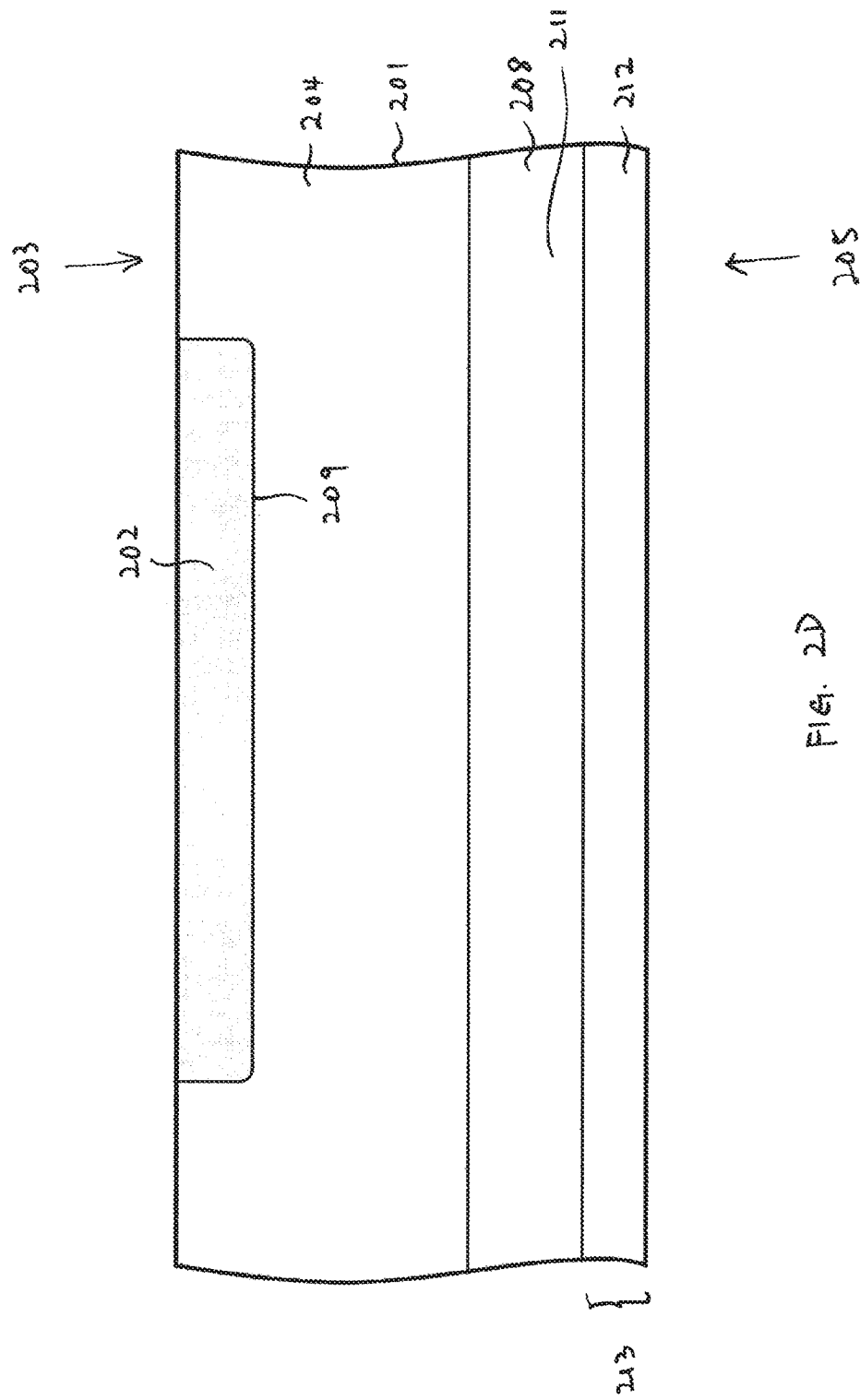

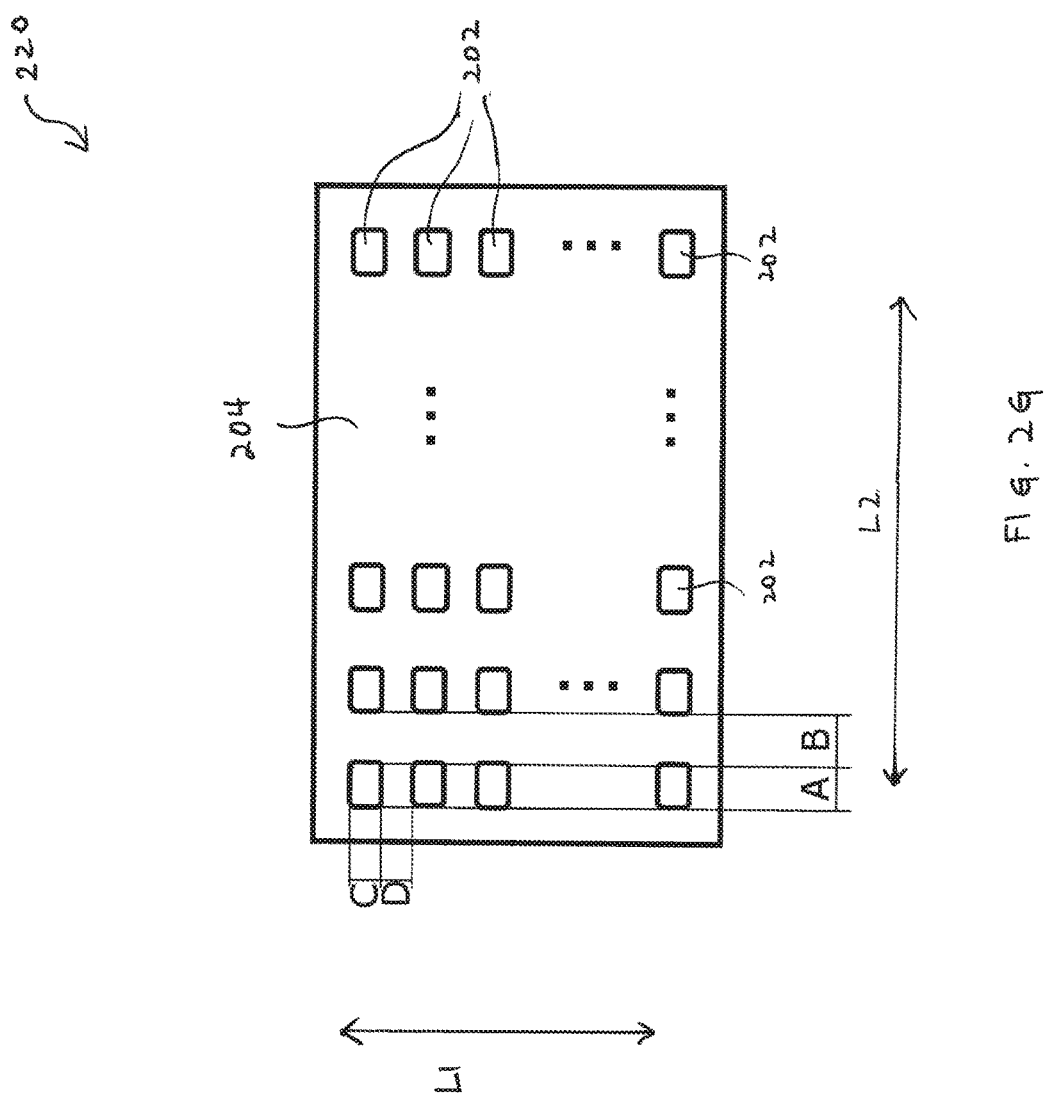

RADIATION DETECTOR AND A METHOD FOR FORMING A SEMICONDUCTOR DEVICE

TECHNICAL FIELD

Examples relate to concepts for semiconductor structures, and in particular to a radiation detector, and methods for forming a semiconductor device.

BACKGROUND

Semiconductor-based radiation detectors may be used to detect, identify, and/or measure trajectories of ionizing particles. As the energies of ionizing particles to be detected increase, the requirements of a radiation detector's robustness to radiation may increase as well. It may be desired to reduce a thickness of a radiation detector as a thinner radiation detector may provide an improved signal compared to a thicker radiation detector after radiation. For some radiation detection cases, it may be desired to produce a thinner radiation detector which may be as large as possible. For example, a radiation detector that may be manufactured as uniformly and as reliably as possible over a large semiconductor wafer area may be desired.

SUMMARY

Some embodiments relate to a method for forming a semiconductor device. The method comprises forming an amorphous semiconductor layer adjacent to a lightly doped region of a semiconductor wafer. The lightly doped region forms at least part of a back side of the semiconductor wafer, and the lightly doped region has a first conductivity type. The method further comprises incorporating dopants into the amorphous semiconductor layer during or after forming the amorphous semiconductor layer. The method further comprises annealing the amorphous semiconductor layer to transform at least a part of the amorphous semiconductor layer into a substantially monocrystalline semiconductor layer and to form a highly doped region in the monocrystalline semiconductor layer at the back side of the semiconductor wafer. The highly doped region has the first conductivity type.

Some embodiments relate to a method for forming a semiconductor device. The method comprises forming a polycrystalline semiconductor layer adjacent to a lightly doped region of a semiconductor wafer. The lightly doped region forms at least part of a back side of the semiconductor wafer, and the lightly doped region has a first conductivity type. The method further comprises incorporating dopants into the polycrystalline semiconductor layer during or after forming the polycrystalline semiconductor layer. The method further comprises annealing the polycrystalline semiconductor layer to transform at least a part of the polycrystalline semiconductor layer into a substantially monocrystalline semiconductor layer and to form a highly doped region in the monocrystalline semiconductor layer at the back side of the semiconductor wafer. The highly doped region has the first conductivity type.

Some embodiments relate to a radiation detector. The radiation detector comprises a first cathode or anode doping region of a diode structure located at a back side of a semiconductor substrate within the semiconductor substrate. The first cathode or anode region has a first conductivity type. The radiation detector further comprises at least one second cathode or anode doping region of the diode structure located within the semiconductor substrate at a front side of the semiconductor substrate. The second cathode or anode region has a second conductivity type. The first cathode or anode doping region comprises a lightly doped region and a highly doped region. The lightly doped region is located between the second cathode or anode doping region and the highly doped region. A doping concentration of the lightly doped region is in a range between $1*10^{11}$ dopants per $cm^3$ and $1*10^{14}$ dopants per $cm^3$. A maximal vertical dimension of the lightly doped region is in a range between 10 µm and 600 µm. A doping concentration of the highly doped region is in a range between $1*10^{14}$ dopants per $cm^3$ and $1*10^{17}$ dopants per $cm^3$. A maximal vertical dimension of the highly doped region is in a range between 100 nm and 30 µm.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A to 2G show schematic illustrations of a method for forming a semiconductor device.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
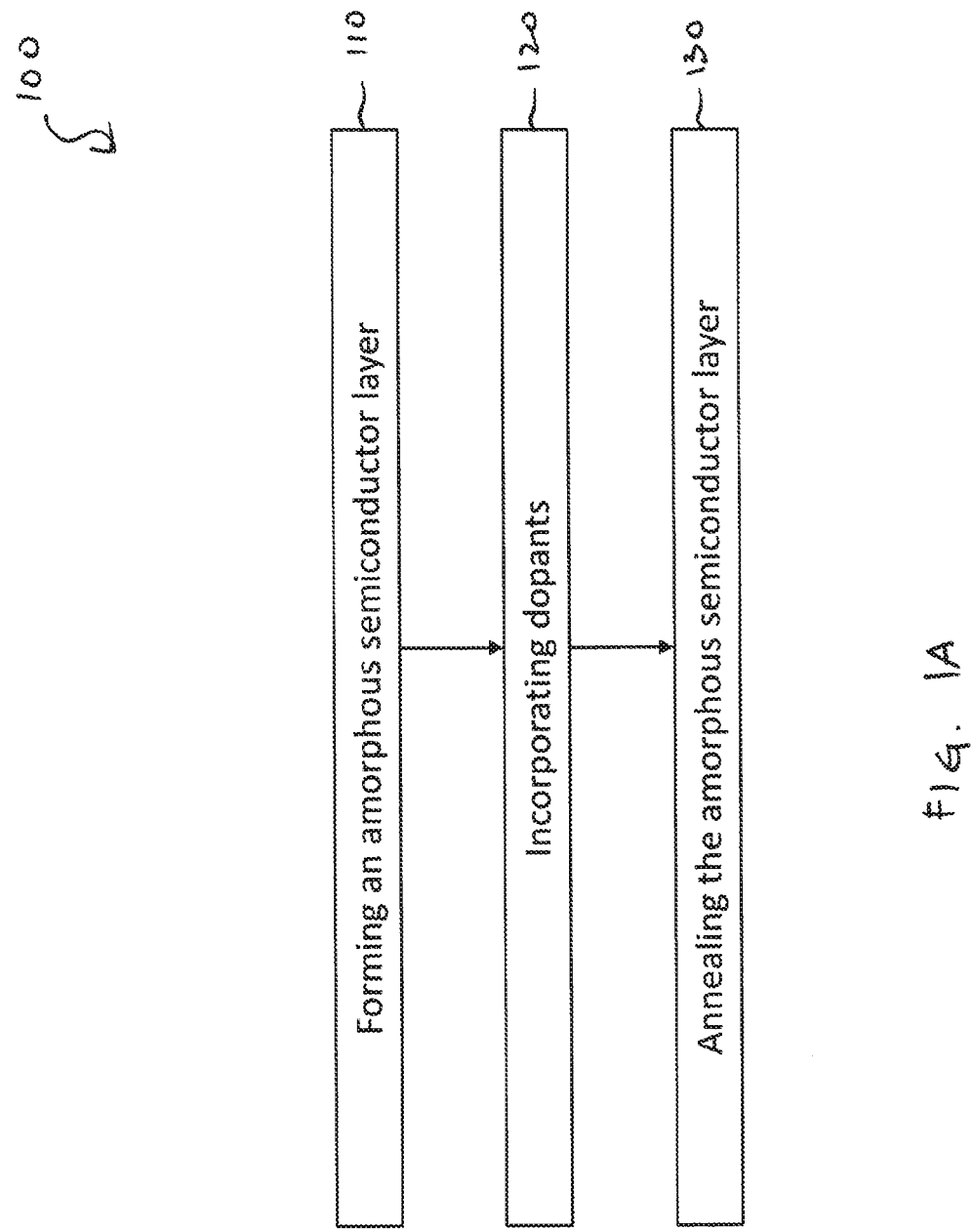
FIG. 1A shows a flow chart of a method for forming a semiconductor device.

FIG. 1A shows a flow chart of a method 100 for forming a semiconductor device according to an example.

The method 100 comprises forming an amorphous semiconductor layer adjacent to a lightly doped region of a semiconductor wafer (Block 110). The lightly doped region forms at least part of a back side of the semiconductor wafer, and the lightly doped region has a first conductivity type.

The method 100 further comprises incorporating dopants into the amorphous semiconductor layer during or after forming the amorphous semiconductor layer (Block 120).

The method 100 further comprises annealing the amorphous semiconductor layer to transform at least a part of the amorphous semiconductor layer into a substantially monocrystalline semiconductor layer and to form a highly doped region in the monocrystalline semiconductor layer at the back side of the semiconductor wafer (Block 130). The highly doped region has the first conductivity type.

Due to the amorphous semiconductor layer being able to recrystallize into a substantially monocrystalline semiconductor layer at the relatively low process temperatures, the highly doped region may be formed in the transformed monocrystalline semiconductor layer at relatively low process temperatures (e.g. at temperatures lower than 550° C.). Additionally, thin semiconductor devices (having thicknesses of less than 300 μm) may be formed using the method 100. Annealing the amorphous semiconductor layer may lead to the highly doped region having a sufficiently large vertical dimension (or extension), and the highly doped region extending laterally over a large lateral dimension of the device (e.g. over at least an 8 inch or a 12 inch semiconductor wafer) after the annealing process. During the operation of the formed semiconductor device, the highly doped region may be effective as a field stop region of a diode structure of the semiconductor device, and/or may prevent a space charge region from bordering (or extending or reaching) into a back side contact metallization layer of the semiconductor device. Additionally, the highly doped region may avoid a reduction of the breakdown voltage and/or an increase in leakage current of the semiconductor device.

The amorphous semiconductor layer may be an amorphous silicon layer (e.g. an amorphous α-silicon layer), or alternatively, a polysilicon layer, for example. Alternatively or optionally, other suitable amorphous semiconductor layers semiconductor layers may be used. The amorphous semiconductor layer may have an average thickness of between 100 nm and 10 μm. (or e.g. between 500 nm and 5 μm, or e.g. or e.g. between 1 μm and 3 μm, or e.g. between 1 μm and 2 μm).

The amorphous semiconductor layer may be formed at (or on) a lateral surface of the semiconductor wafer. For example, the amorphous semiconductor layer may be formed at (or on) a back side (e.g. a back side lateral surface) of the semiconductor wafer. The amorphous semiconductor layer may cover most of the (back side) surface of the semiconductor wafer. For example, optionally, the amorphous semiconductor layer may be formed on more than 50% (or e.g. more than 80%, or e.g. more than 90%, or e.g. substantially all) of the back side surface of the semiconductor wafer. Optionally, the amorphous semiconductor layer may be formed by sputtering or by chemical vapor deposition (CVD).

The amorphous semiconductor layer formed at the back side of the semiconductor wafer may be formed (directly) adjacent to the lightly doped region having the first conductivity type located in the semiconductor wafer. The lightly doped region having the first conductivity type may be located in (or within) the semiconductor wafer. Before forming the amorphous semiconductor layer, the lightly doped region having the first conductivity type may be located in the semiconductor wafer directly at the back side (e.g. at the back lateral surface) of the semiconductor wafer. The lightly doped region having the first conductivity type may be a drift region of a diode structure formed (or to be formed) in (or at) the semiconductor wafer, for example.

The method 100 may include forming the lightly doped region having the first conductivity type before forming the amorphous semiconductor layer. For example, the lightly doped region having the first conductivity type may be part of the bulk substrate of the semiconductor wafer. Thus, the lightly doped region having the first conductivity type may have the same doping as the bulk semiconductor wafer. The lightly doped region having the first conductivity type may have an average net doping concentration of between $1*10^{11}$ dopants per $cm^3$ and $1*10^{14}$ dopants per $cm^3$ (or e.g. between $5*10^{11}$ dopants per $cm^3$ and $1*10^{14}$ dopants per $cm^3$ or e.g. between $1*10^{12}$ dopants per $cm^3$ and $1*10^{13}$ dopants per $cm^3$). The average net doping concentration may be a measured number of dopants per volume averaged over the lightly doped region, for example.

The dopants (which cause the first conductivity type) may be incorporated 120 into the amorphous semiconductor layer by ion implantation after forming 110 the amorphous semiconductor layer, for example. Optionally, an implantation dose for implanting the dopants causing the first conductivity type may be greater than $2*10^{12}$ doping atoms per $cm^2$ (or e.g. greater than $1*10^{13}$ doping atoms per $cm^2$ or e.g. greater than $1*10^{14}$ doping atoms per $cm^2$ or e.g. greater than $1*10^{15}$ doping atoms per $cm^2$ or e.g. greater than $1*10^{16}$ doping atoms per $cm^2$), for example. An implantation surface area of the amorphous semiconductor layer exposed to the implantation (in Block 120) may be substantially equal to (or e.g. more than 95% of, or e.g. more than 99% of) the surface area of the amorphous semiconductor layer.

Alternatively or optionally, the dopants causing the first conductivity type may be incorporated into the amorphous semiconductor layer in-situ during the forming of the amorphous semiconductor layer (e.g. by CVD).

The dopants causing the first conductivity type may be incorporated into the amorphous semiconductor layer such that an average doping concentration of the of the highly doped region having the first conductivity type after annealing the amorphous semiconductor layer is at least $1*10^{14}$ dopants per $cm^3$ (or e.g. between $1*10^{14}$ dopants per $cm^3$ and $1*10^{17}$ dopants per $cm^3$, or e.g. between $1*10^{14}$ dopants per $cm^3$ and $1*10^{16}$ dopants per $cm^3$). The average doping concentration may be a measured number of dopants per volume averaged over the highly doped region having the first conductivity type, for example.

The dopants incorporated into the amorphous semiconductor layer (in Block 120) may be boron, difluoroboron, aluminum, nitrogen, gallium, and/or indium dopants. These dopants incorporated into the amorphous semiconductor layer may cause the highly doped region to have the first conductivity type (e.g. p type conductivity).

The incorporation of the dopants may be controlled (e.g. by controlling the implantations dose and/or implantations energy) so that after the incorporation of dopants, more than 50% (or e.g. more than 70%, or e.g. more than 90%) of the incorporated dopants are located at a penetration depth equal to or less than a thickness of the amorphous semiconductor layer. For example, a (maximum) penetration depth of more than 50% (or e.g. more than 70%, or e.g. more than 90%) of the incorporated dopants causing the first conductivity type may be equal to or less than a thickness of the amorphous semiconductor layer. The maximum penetration depth may be a largest distance range travelled (or reached) by the incorporated dopants causing the first conductivity type from an entry (or implantation) surface into the amorphous semiconductor layer and/or the semiconductor wafer. The distance may be measured in a substantially perpendicular or orthogonal direction to the lateral entry surface of the amorphous semiconductor layer.

Annealing (in Block 130) the amorphous semiconductor layer may include heating the amorphous semiconductor layer at a temperature of less than (or equal to) 550° C. (over more than 80%, or e.g. more than 90%, or e.g. over the entire annealing process). The amorphous semiconductor layer may be heated for between 1 hour and 5 hours at 500° C. for example. The annealing may be controlled to recrystallize the amorphous semiconductor layer. For example, the annealing may be controlled to recrystallize completely (or e.g. more than 80% of, or e.g. more than 90% of) the amorphous semiconductor layer. The annealing may transform at least part of (e.g. completely, or e.g. more than 80% of, or e.g. more than 90% of) the amorphous semiconductor layer into the substantially monocrystalline semiconductor layer.

Additionally or optionally, the annealing of the amorphous semiconductor layer (in Block 130) may be controlled, so that the highly doped region having the first conductivity type may directly contact the lightly doped region having the first conductivity type.

Additionally, optionally, or alternatively an irradiation with microwaves may be used to crystallize the silicon layers. For example, annealing the amorphous semiconductor layer may include irradiating the amorphous semiconductor layer with microwaves. If the amorphous silicon layer is doped with hydrogen, the crystallization may already start at relatively low temperatures below 400° C.

Additionally or optionally, the recrystallization process of the amorphous silicon layer may be supported by the exposure to hydrogen plasma and/or by the interaction with the backside metallization to achieve metal-induced recrystallization. For example, the method 100 may further include exposing the amorphous semiconductor layer to a hydrogen plasma during or after annealing the amorphous semiconductor layer.

The lightly doped region having the first conductivity type and the highly doped region having the first conductivity type may form at least part of a first cathode or anode doping region of a diode structure of the semiconductor device. The first cathode or anode doping region may have the first conductivity type. During the operation of the semiconductor device, the highly doped region having the first conductivity type may prevent a space charge region from bordering (or extending or reaching) into a back side contact metallization layer of the semiconductor device. The formed highly doped region may avoid a reduced breakdown voltage and/or an increased leakage current of the semiconductor device, for example.

The method 100 may further include forming at least one second cathode or anode doping regions having a second conductivity type (e.g. n type conductivity) in the semiconductor wafer before forming the amorphous semiconductor layer. The second cathode or anode doping region may be formed within the semiconductor wafer at a front side (e.g. a front lateral surface) of the semiconductor wafer. For example, the second cathode or anode region may form at least part of a front side of the semiconductor wafer. The second cathode or anode doping region may be formed by implanting dopants causing the second conductivity type into the semiconductor wafer from the front lateral surface of the semiconductor wafer and annealing the semiconductor wafer to form the second cathode or anode doping region of the diode structure. An average doping concentration of the second cathode or anode doping region having the second conductivity type after annealing the semiconductor wafer may be at least $1*10^{16}$ dopants per cm$^3$ (or e.g. between $1*10^{16}$ dopants per cm$^3$ and $1*10^{20}$ dopants per cm$^3$, or e.g. between $1*10^{16}$ dopants per cm$^3$ and $1*10^{18}$ dopants per cm$^3$. The average doping concentration may be a measured number of dopants per volume averaged over the second cathode or anode doping region having the first conductivity type, for example.

After annealing the semiconductor wafer to form the at least one second cathode or anode doping region, a p-n junction may be formed between the at least one second cathode or anode doping region having the second conductivity type and the lightly doped region having the first conductivity type. The p-n junction formed between the at least one second cathode or anode doping region having the second conductivity type and the lightly doped region of the first cathode or anode doping region having the first conductivity type may allow the semiconductor device to function as a radiation detector, for example. During the operation of the radiation detector, the p-n junction may be reverse biased by an electrical voltage applied to the at least one second cathode or anode doping region and the first cathode or anode doping region by contact metallization layers (electrodes). The reverse bias may result in a space charge region and an electric field being generated in the semiconductor wafer. If ionizing radiation enters the semiconductor wafer during the operation of the radiation detector, generated charge carriers created within the depletion region may be collected due to the electric field. The electric field may cause any electrons created in or near the p-n junction to be swept towards the n type material (e.g. towards the second cathode or anode doping region) and any holes may be swept towards the p type material (e.g. towards the first cathode or anode doping region). These electron-hole pairs created within the depletion region by the ionizing radiation may be swept out of the depletion region by the electric field, leading to the generation of a current pulse (e.g. an electrical signal) that may be measured between the electrodes.

Additionally or optionally, the method 100 may include forming a plurality of second cathode or anode doping regions having the second conductivity type in the semiconductor wafer. Portions of the lightly doped region may be located laterally between adjacent second cathode or anode doping regions of the plurality of second cathode or anode doping regions.

Additionally or optionally, it may be possible, prior to (or after) the deposition of the p doped amorphous silicon layer, to perform an amorphizing implantation (e.g. an amorphizing bor implantation) into the back of the disc (semiconductor wafer) in order to further reduce the risk of the space-charge region reaching through to the back side contact metallization layer. The amorphizing implantation may include incorporating dopants causing the first conductivity type into the lightly doped region from the back side of the semiconductor wafer. When performing the amorphizing boron (or BF2) implantation, relatively low process temperatures (e.g. in the range of 350° C. to 400° C.) may already be sufficient to provide a relatively high p doping. For example, in case of a pure bor implantation, the doses may be in the range of $10^{16}$ ions per $cm^2$ and may be an order of magnitude lower for a BF2 implantation. If the implantation is performed at temperatures below room temperature, the amorphization threshold may drop sharply. The implantation may take place before or after the deposition of the amorphous silicon layer to achieve a strong activation and thus a good backside contact following the corresponding annealing process.

Optionally, it may be conceivable to interrupt the deposition of the amorphous semiconductor (e.g. silicon) layer once or several times, and to incorporate dopants causing the first conductivity type (e.g. performing a boron implantation) after each interruption to strengthen or also to ensure the p doping of the amorphous silicon layer. For example, the method 100 is not necessarily limited to forming only one amorphous semiconductor layer at the back side of the semiconductor wafer. Optionally, the method 100 may include forming a plurality of amorphous semiconductor layers and incorporating dopants into the plurality of amorphous semiconductor layers, to form a plurality of amorphous semiconductor layers comprising the incorporated dopants. After forming the plurality of amorphous semiconductor layers, the method 100 may further include annealing the plurality of amorphous semiconductor layers comprising the incorporated dopants (by an oven heating process or by laser thermal annealing at a temperature of less than 550° C.) to transform at least a part of (or all of) the plurality of amorphous semiconductor layers into the substantially monocrystalline semiconductor layer and to form the highly doped region having the first conductivity type in the monocrystalline semiconductor layer.

Optionally, the method 100 may include alternatingly forming one or several amorphous semiconductor layers and incorporating dopants into the amorphous semiconductor layer or layers, respectively, to form the one or plurality of amorphous semiconductor layers comprising the incorporated dopants. Optionally, the method 100 may include individually annealing each amorphous semiconductor layer of the plurality of amorphous semiconductor layers by laser thermal annealing plurality for at least one (or e.g. one) annealing time interval. The laser thermal annealing may be controlled so that a temperature at a front side of the semiconductor wafer remains below 420° C. during the laser thermal annealing. For example, the annealing time interval may be so short that a temperature at a front side of the semiconductor wafer remains below 420° C. during the laser thermal annealing. For example, the laser annealing time interval may be extremely short so that the resulting steep temperature gradient avoids temperatures exceeding 400° C. or even 300° C. at (or on) the front side of the wafer, because this may result in detrimental effects on the front side structures. The laser annealing process may result in a melting of the implanted silicon layers.

The method 100 may further include forming a very highly doped region having the first conductivity type at the back side of the semiconductor wafer after forming the highly doped region having the first conductivity type. For example, forming the very highly doped region having the first conductivity type may include incorporating dopants into the monocrystalline semiconductor layer after forming the highly doped region in the monocrystalline semiconductor layer and annealing at least part of the monocrystalline semiconductor layer by laser thermal annealing to form the very highly doped region having the first conductivity type in the monocrystalline semiconductor layer. The dopants may be incorporated into the monocrystalline semiconductor such that an average doping concentration of the very highly doped region after annealing at least part of the monocrystalline semiconductor is at least $1*10^{16}$ dopants per $cm^3$ (or e.g. between $1*10^{16}$ dopants per $cm^3$ and $1*10^{20}$ dopants per $cm^3$, or e.g. between $1*10^{16}$ dopants per $cm^3$ and $1*10^{18}$ dopants per $cm^3$. The laser thermal annealing may be controlled such that an annealing depth caused by the laser thermal annealing is less than 30% (or e.g. less than 20%, or e.g. less than 10%) of a minimal (or smallest) thickness of the monocrystalline semiconductor layer. For example, the annealing depth caused by the laser thermal annealing may be less than 1 μm (or e.g. less than 800 nm, or e.g. less than 600 nm).

Alternatively, forming the very highly doped region having the first conductivity type may include forming a back side amorphous semiconductor layer adjacent (e.g. directly adjacent) to the highly doped region having the first conductivity type, and incorporating dopants into the back side amorphous semiconductor layer. Forming the very highly doped region having the first conductivity type may further include annealing (by laser thermal annealing) the back side amorphous semiconductor layer to transform at least a part of the back side amorphous semiconductor layer into a substantially monocrystalline semiconductor layer and to form the very highly doped region in the monocrystalline semiconductor layer at the back side of the semiconductor wafer.

The method 100 may further include forming a back side contact metallization layer (electrode) at the back side of the semiconductor wafer after forming the highly doped region and/or after forming the very highly doped region. The back side contact metallization layer may be formed directly adjacent to the highly doped region of the first cathode or anode doping region (if the very highly doped region of the first cathode or anode doping region is not present), or may be formed directly adjacent to the very highly doped region of the first cathode or anode doping region if the very highly doped region is present. The method 100 may further include forming a front side contact metallization layer at the front side of the semiconductor wafer before (e.g. prior to) forming the highly doped region and/or after forming the very highly doped region. The front side contact metallization layer (electrode) maybe formed directly adjacent to the at least one second cathode or anode doping region, for example.

A doping region comprising the first conductivity type may be a p doped region (e.g. caused by incorporated dopants being boron, difluoroboron, aluminum, nitrogen, gallium, and/or indium dopants). Consequently, the second conductivity type indicates an opposite n doped region. Alternatively, it may be that a doping region comprising the first conductivity type may be an n doped region (e.g. caused by incorporated dopants being nitrogen ions, phosphor, antimony, selenium, arsenic, and/or bismuth dopants) and consequently, the second conductivity type indicates an opposite p doped region. In other words, the first conductivity type may indicate a p doping and the second conductivity type may indicate an n doping or vice-versa.

A lateral surface or a lateral dimension (e.g. a diameter or a length) of a main surface (e.g. a front surface or a back surface) of the semiconductor wafer may be more than 100 times larger (or more than 1000 times or more than 10000 times) than a distance between a front lateral surface of the semiconductor wafer and a back surface of semiconductor wafer, for example. A lateral surface of the amorphous semiconductor layer may be a surface of the amorphous semiconductor layer which is parallel to the lateral surface of the semiconductor wafer, for example.

The front side surface of the semiconductor wafer may be a semiconductor surface of the semiconductor wafer towards metal layers, insulation layers or passivation layers on top of the semiconductor surface. In comparison to a basically vertical edge (e.g. resulting from separating the semiconductor wafer from others) of the semiconductor wafer, the surface of the semiconductor wafer may be a basically horizontal surface extending laterally. The surface of the semiconductor wafer may be a basically even plane (e.g. neglecting unevenness of the semiconductor structure due to the manufacturing process or trenches). For example, the front side surface of the semiconductor wafer may be the interface between the semiconductor material and an insulation layer, metal layer or passivation layer on top of the semiconductor wafer. For example, more complex structures may be located at the front side surface of the semiconductor wafer than at the back side surface of the semiconductor wafer. A back side surface of the semiconductor wafer may be a side or surface of the semiconductor wafer at which a back side metallization contact structure (e.g. an anode or cathode contact structure) covering more than 50% (or e.g. more than 80%) of the back side surface of the semiconductor wafer is to be formed (or is formed).

A vertical direction may be perpendicular or orthogonal to a lateral surface of the semiconductor wafer (or to a lateral surface of the amorphous semiconductor layer), for example. The implantation surface or entry surface may be the surface (of the semiconductor wafer or a layer) at which the implanted doping ions enter the semiconductor wafer or layer. A doping region formed by the implant of doping ions (e.g. at an end of range region of the doping ion implant) may be located at a depth with respect to an implantation surface used for implanting the doping ions into the semiconductor wafer, for example.

The semiconductor wafer may be a silicon-based substrate (e.g. a silicon (Si) substrate or silicon wafer). Alternatively, the semiconductor wafer of the semiconductor device may be a silicon carbide (SiC) wafer, a gallium arsenide (GaAs) wafer or a gallium nitride (GaN) wafer, for example. The semiconductor wafer may be an epitaxial semiconductor wafer, a Czochralski (CZ) semiconductor wafer, a magnetic CZ semiconductor wafer, or a float zone semiconductor wafer, for example.

The semiconductor device to be formed may be (or may include) a radiation detector (e.g. a strip detector or a pixel detector. Silicon strip detectors may be used in high-energy physics experiments to measure trajectories of ionizing particles. The detectors may be exposed to intensive radiation degrading the sensitivity over the whole lifetime. In high-energy physics experiments, the energies used may be further increased, and thus the requirements with regard to the detector's robustness to radiation may increase as well.

The method 100 provides one or more concepts for producing or for forming thinner detectors (e.g. 200 μm thick) which may provide more signal after irradiation than thicker detectors (e.g. 300 μm thick. The method 100 provides one or more concepts for producing thin detectors on discs as large as possible. The method 100 provides one or more concepts for the required number of detectors as economically as possible, to minimize the mass used in the experiments, and to manufacture detectors as robust against radiation as possible.

The method 100 provides one or more concepts for using p doped base zones. When using p doped base zones (e.g. having a p type lightly doped drift region), processing in thin conditions may be critical when using larger-diameter discs (e.g., 8 inch and/or 12 inch). High-temperature processes in particular cannot be used, for example. The method 100 facilitates a p doped zone (e.g. the highly doped region), on the back of the disc having a sufficient vertical extension at relatively low temperatures. Even though there is the possibility to generate a highly p doped region using an acceptor implantation in connection with a melt or also a non-melt laser process, such layers may generally be subject to defects (e.g., holes) caused by particles on the surface prior to the ion implantation or prior to the laser process. Therefore, it may be desirable to produce a p doped layer (e.g. the highly doped region) which may extend in vertical direction and be sufficiently homogenous in lateral direction at relatively low temperatures to prevent, using this layer, the space-charge region from reaching through up to the backside metallization in blocking state.

The method 100 provides one or more concepts for generating a p doped field-stop zone (e.g. the highly doped region) at low temperatures by depositing an amorphous silicon layer doped with acceptor atoms on the back of the disc. The amorphous silicon layer may recrystallize at a relatively low process temperature. For examples, 450° C. to 550° C. may be sufficient, and may be uncritical at the usual final thicknesses of the detector discs (e.g., 200 μm).

Optionally, the additional very highly p doped layer (e.g. the very highly doped region) generated using acceptor implantation in connection with laser annealing may be incorporated near to the surface into the back of the disc, which may improve an ohmic contact to the backside contact and/or reduce the risk of the space-charge region reaching through to the back side contact metallization layer. The very highly p doped layer (e.g. the very highly doped region) may optionally be omitted in the radiation detector if the contact resistance does not play a major role, and/or if in the case of the p doping, an ohmic contact is already achieved at relatively low doping concentrations.

Figure 1B:
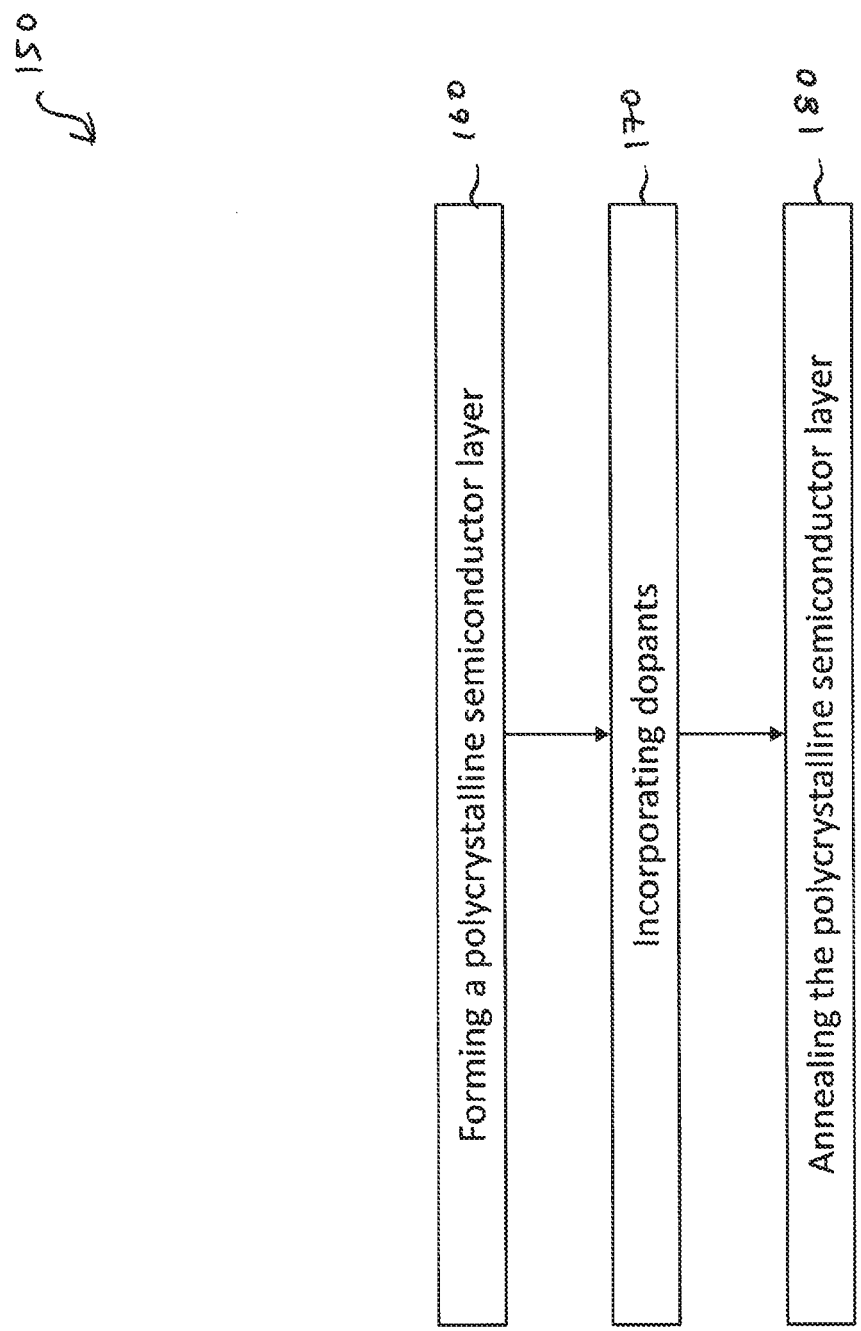
FIG. 1B shows a flow chart of a further method for forming a semiconductor device

It may be understood that optionally or alternatively, the amorphous semiconductor layer may be a polycrystalline semiconductor layer instead. FIG. 1B shows a flow chart of a further method 150 for forming a semiconductor device.

The method 150 may include forming a polycrystalline semiconductor layer adjacent to a lightly doped region of a semiconductor wafer (Block 160), wherein the lightly doped region forms at least part of a back side of the semiconductor wafer, and wherein the lightly doped region has a first conductivity type.

The method 150 may further include incorporating dopants into the polycrystalline semiconductor layer during or after forming the polycrystalline semiconductor layer (Block 170).

The method 150 may further include annealing the polycrystalline semiconductor layer to transform at least a part of the polycrystalline semiconductor layer into a substantially monocrystalline semiconductor layer and to form a highly doped region in the monocrystalline semiconductor layer at the back side of the semiconductor wafer (Block 180). The highly doped region has the first conductivity type Due to the use of the polycrystalline semiconductor layer, the highly doped region extending laterally over a large lateral dimension of the device maybe formed. Additionally, using the polycrystalline semiconductor layer may reduce processing costs.

The method 150 may include one or more of the features of method 100. However, instead of an amorphous semiconductor layer a polycrystalline semiconductor layer may be used instead. Compared to the amorphous semiconductor layer, the polycrystalline semiconductor layer may be transformed to a monocrystalline semiconductor layer at temperatures higher than 550° C.

More details and aspects are mentioned in connection with the embodiments described above or below. The embodiments shown in FIG. 1B may comprise one or more optional additional features corresponding to one or more aspects mentioned in connection with the proposed concept or one or more embodiments described above (e.g. FIG. 1A) or below (FIGS. 2A to 3).

FIGS. 2A to 2E show schematic illustrations of at least part of a method 200 for forming a semiconductor device according to one or more examples. The method 200 may be implemented similar to the method described in connection with FIGS. 1A and/or 1B.

Figure 2A:
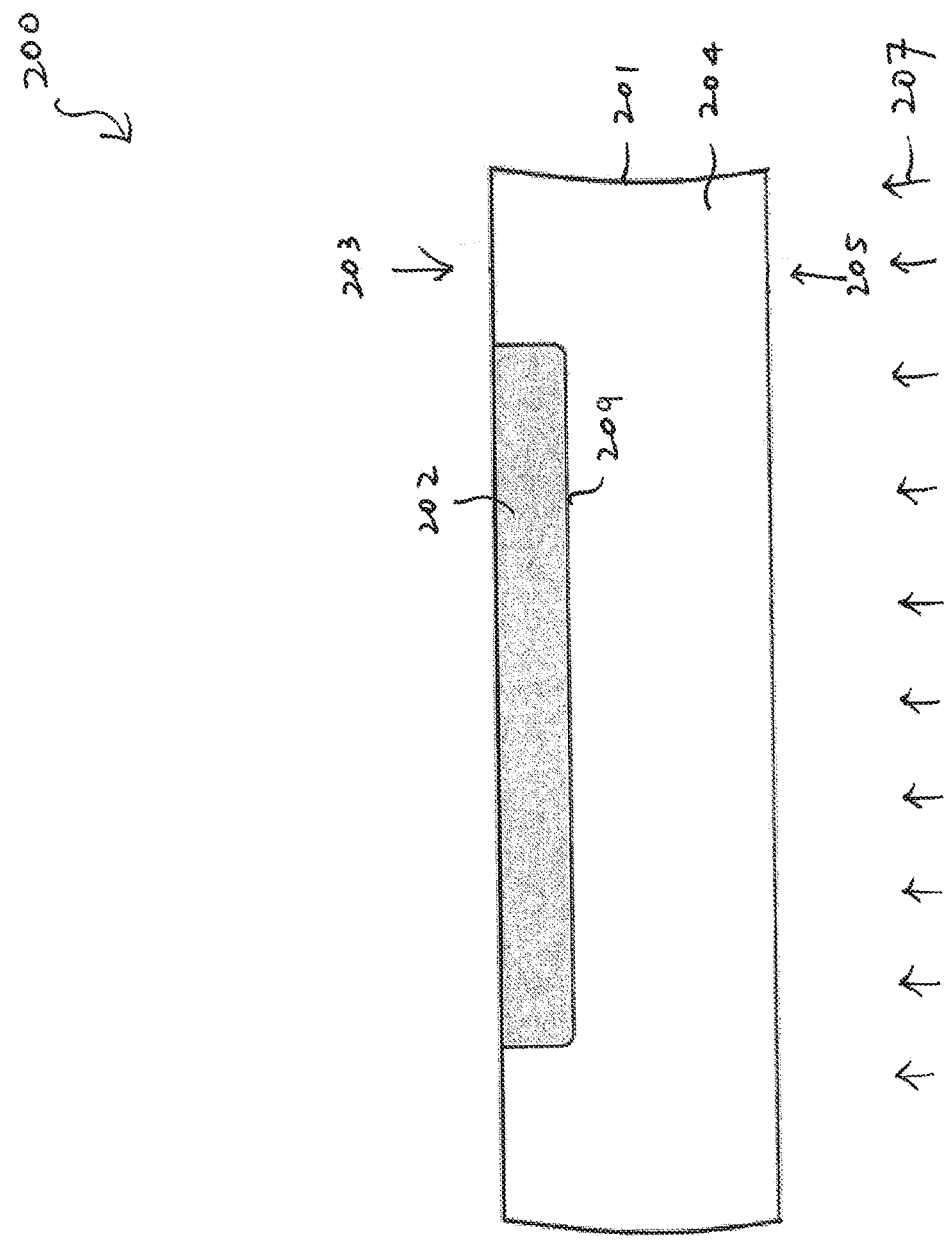
Figure 3:
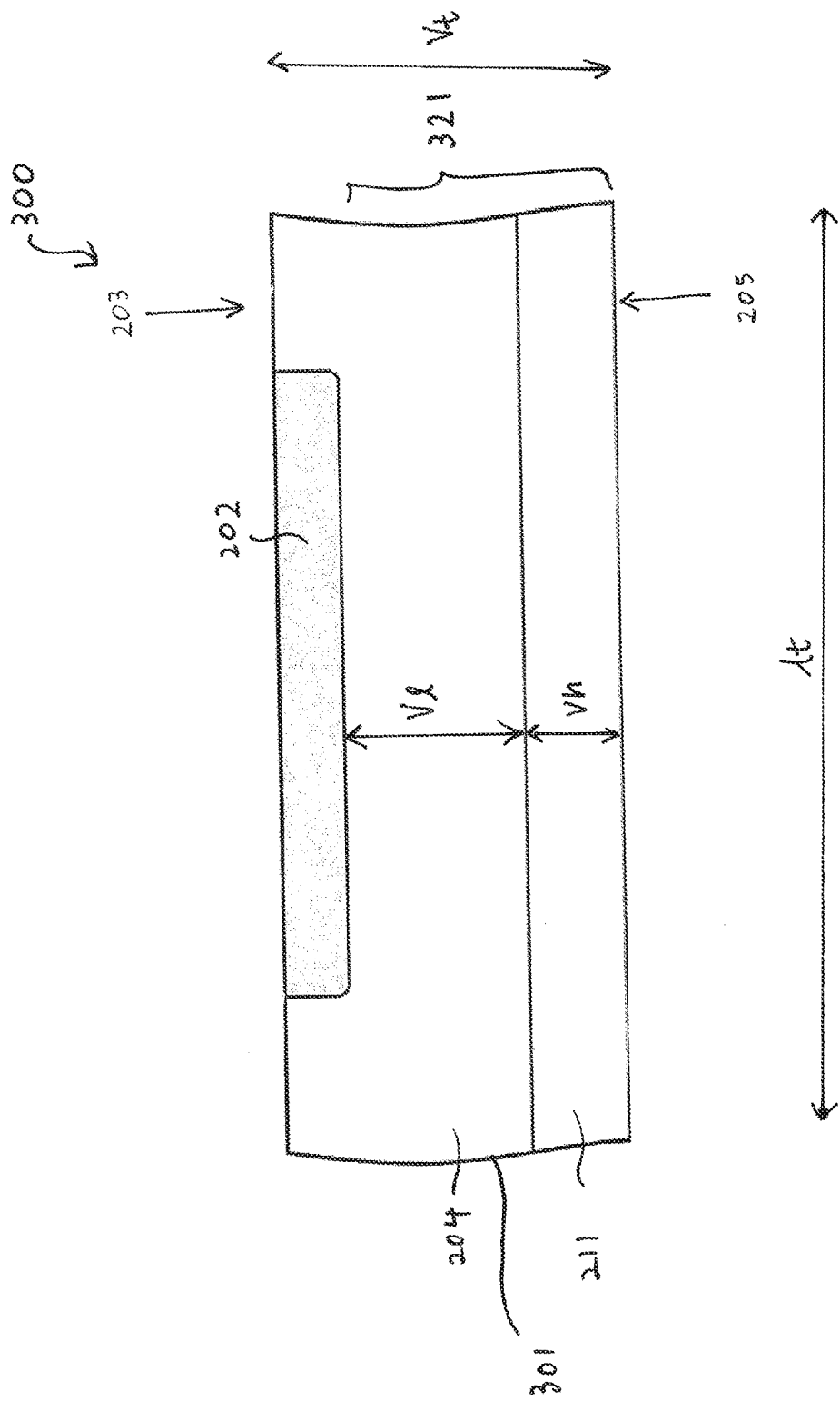
FIG. 3 shows a schematic illustration of a radiation detector.

As shown in the cross-section view of a semiconductor wafer 201 in FIG. 2A, the method 200 may include forming at least one second cathode or anode doping region 202 having a second conductivity type (e.g. a $n^+$-type conductivity emitter) in the semiconductor wafer 201. The semiconductor wafer 201 may have a (bulk) first conductivity type (e.g. a p type conductivity). The second cathode or anode doping region 202 having the second conductivity type may be formed within the semiconductor wafer 201 at a front side 203 (or front lateral surface 203) of the semiconductor wafer 201. The second cathode or anode doping region 202 may be formed by implanting dopants causing the second conductivity type into the semiconductor wafer 201 from the front side 203 of the semiconductor wafer and annealing the semiconductor wafer 201 to form the second cathode or anode doping region 202 of a diode structure.

After annealing the semiconductor wafer 201 to form the second cathode or anode doping region 202, a p-n junction 209 may be formed between the at least one second cathode or anode doping region 202 having the second conductivity type and the lightly doped region 204 of the semiconductor wafer 201 having the first conductivity type. The lightly doped region 204 having the first conductivity type may be part of the bulk semiconductor wafer 201, and may have the same concentration and conductivity type as the bulk semiconductor wafer 201. For example, the lightly doped region having the first conductivity type may have an average net doping concentration of between $1*10^{12}$ dopants per $cm^3$ and $1*10^{14}$ dopants per $cm^3$ (or e.g. between $1*10^{12}$ dopants per $cm^3$ and $1*10^{13}$ dopants per $cm^3$). The lightly doped region may have a resistivity of between 3 kΩcm and 8 kΩcm, for example. The lightly doped region having the first conductivity type may be located in the semiconductor wafer directly at the back side 205 (or back lateral surface) of the semiconductor wafer 201 and may form at least part of a back side of the semiconductor wafer 201. The lightly doped region having the first conductivity type may form a lightly doped p type base zone of the diode structure.

Additionally or optionally, after forming the second cathode or anode doping region and before forming the amorphous semiconductor layer (in FIG. 2B), the method 100 may further include incorporating 207 dopants causing the first conductivity type into the lightly doped region 204 from the back side 205 of the semiconductor wafer 201. For example, the process may be an amorphizing boron implantation process, which may further reduce the risk of a space charge region reaching into back side contact metallization layer to be formed at the back side 205 of the semiconductor wafer 201 during the operation of the semiconductor device.

Figure 2B:
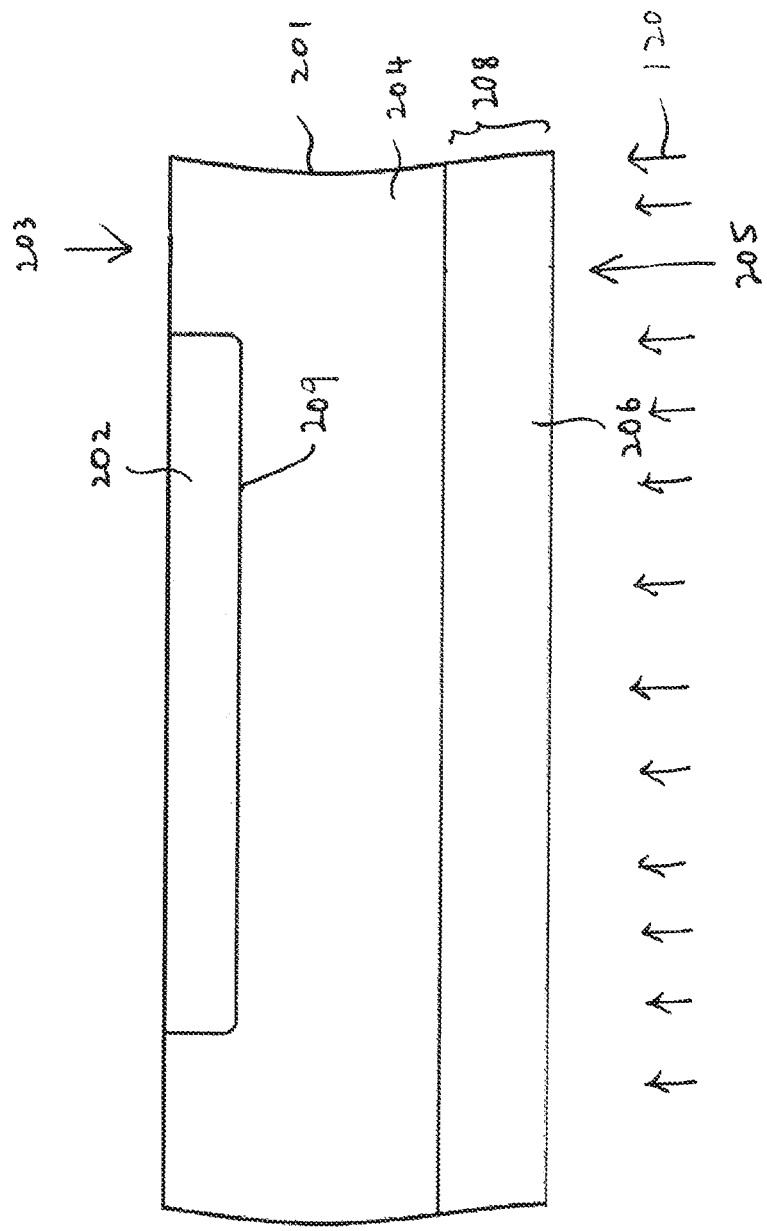

As shown in the cross-sectional view of FIG. 2B, the method 200 may further include forming an amorphous semiconductor layer 206 adjacent to the lightly doped region 204 of the semiconductor wafer 201. For example, after forming the at least one second cathode or anode doping region 202 in a semiconductor wafer 201, the amorphous semiconductor layer 206 may be formed at the (back side) surface 205 of the semiconductor wafer 201. The amorphous semiconductor layer may be formed (directly) adjacent to the lightly doped region 204 having the first conductivity type.

As further shown in FIG. 2B, the method 200 may further include incorporating 120 dopants causing the first conductivity type into the amorphous semiconductor layer 206 during or after forming the amorphous semiconductor layer 206. The dopants incorporated into the amorphous semiconductor layer may be boron, difluoroboron, aluminum, nitrogen, gallium, and/or indium dopants, for example.

The method 200 may further include annealing the amorphous semiconductor layer 206 after incorporating 120 the dopants causing the first conductivity type, to transform at least a part of (or all of) the amorphous semiconductor layer 206 into a substantially monocrystalline semiconductor layer 208 and to form a highly doped region having the first conductivity type in the monocrystalline semiconductor layer 208 at the back side 205 of the semiconductor wafer 201.

As shown in FIG. 2C, the method 200 is not limited to forming only one amorphous semiconductor layer at the back side 205 of the semiconductor wafer 201. Alternatively, instead of forming only one amorphous semiconductor layer at the back side 205 of the semiconductor wafer 201 (as shown in FIG. 2B), the method 200 may include alternatingly forming an amorphous semiconductor layer 206 and incorporating dopants into the amorphous semiconductor layer 206, to form a plurality of amorphous semiconductor layers 206 comprising the incorporated dopants. After incorporating the dopants into the plurality of amorphous semiconductor layers 206, the method 200 may further include annealing the plurality of amorphous semiconductor layers 206 comprising (or including) the incorporated dopants to transform at least a part of (or all of) the plurality of amorphous semiconductor layers 206 into a substantially monocrystalline semiconductor layer 208 and to form the highly doped region in the monocrystalline semiconductor layer 208. The method 200 may include annealing the plurality of amorphous semiconductor layers comprising the incorporated dopants by an oven heating process or by laser thermal annealing at a temperature of less than 550° C. The laser thermal annealing process may be a non-melt laser process, for example. The thickness of each individual amorphous semiconductor layer may be equal to or smaller than as the annealing depth caused by the laser thermal annealing.

As shown in FIG. 2D, the method 200 may further include forming a very highly doped region having the first conductivity type at the back side 205 of the semiconductor wafer 201 after forming the highly doped region 211 having the first conductivity type in the monocrystalline semiconductor layer 208.

Forming the very highly doped region having the first conductivity type may include forming a back side amorphous semiconductor layer 212 adjacent (e.g. directly adjacent) to the highly doped region 211 having the first conductivity type. After forming the back side amorphous semiconductor layer 212, dopants causing the first conductivity type may be incorporated into the back side amorphous semiconductor layer 212. After incorporating the dopants causing the first conductivity type into the back side amorphous polycrystalline semiconductor layer 212, the back side amorphous polycrystalline semiconductor layer 212 may be annealed (by laser thermal annealing) to form the very highly doped region having the first conductivity type in the back side amorphous semiconductor layer at the back side 205 of the semiconductor wafer 201. The annealing may also transform at least a part of (or all of) the back side amorphous semiconductor layer 212 into a back side monocrystalline semiconductor layer 213.

Alternatively, instead of forming the back side amorphous polycrystalline semiconductor layer 212 after forming the highly doped region 211, forming the very highly doped region having the first conductivity type may include incorporating dopants causing the first conductivity type into the monocrystalline semiconductor layer 208 after forming the highly doped region 211 in the monocrystalline semiconductor layer 208. The dopants causing the first conductivity type may be incorporated into the monocrystalline semiconductor layer 208 from the back side 205 of the semiconductor wafer 201. After incorporating the dopants into the monocrystalline semiconductor layer 208, at least part of the monocrystalline semiconductor layer 208 may be annealed (by laser thermal annealing) to form the very highly doped region having the first conductivity type in the monocrystalline semiconductor layer 208.

The laser thermal annealing may be controlled such that an annealing depth caused by the laser thermal annealing is less than 3% (or e.g. less than 2%, or e.g. less than 1%) of a minimal (or smallest) thickness of the monocrystalline semiconductor layer. The amorphous semiconductor layer may have a minimal (or smallest) thickness of between 100 nm and 3 µm. (or e.g. between 200 nm and 2 µm, or e.g. or e.g. between 300 nm and 2 µm, or e.g. between 400 nm and 3 µm). The annealing depth caused by the laser thermal annealing may be controlled by limiting the laser thermal annealing to be carried out one time (or e.g. less than 3 times). For example, a pulsed laser light beam having an energy of between 0.5 Joules per $cm^2$ and 5 Joules per $cm^2$ may be directed towards the amorphous semiconductor layer for one annealing time interval. For example, one annealing time interval may be between 5 ns and 40 ms (or e.g. between 10 ns and 20 ms). The annealing depth caused by the laser thermal annealing may be less than 1 µm (or e.g. less than 800 nm, or e.g. less than 600 nm, or e.g. less than 100 nm). Additionally or optionally, the laser thermal annealing may be controlled such that a temperature at a front side of the semiconductor wafer remains below 420° C. during the laser thermal annealing As shown in the cross-sectional view of FIG. 2E, the method 200 may further include forming a back side contact metallization layer 215 (electrode) and a front side contact metallization layer 216.

Figure 2E:
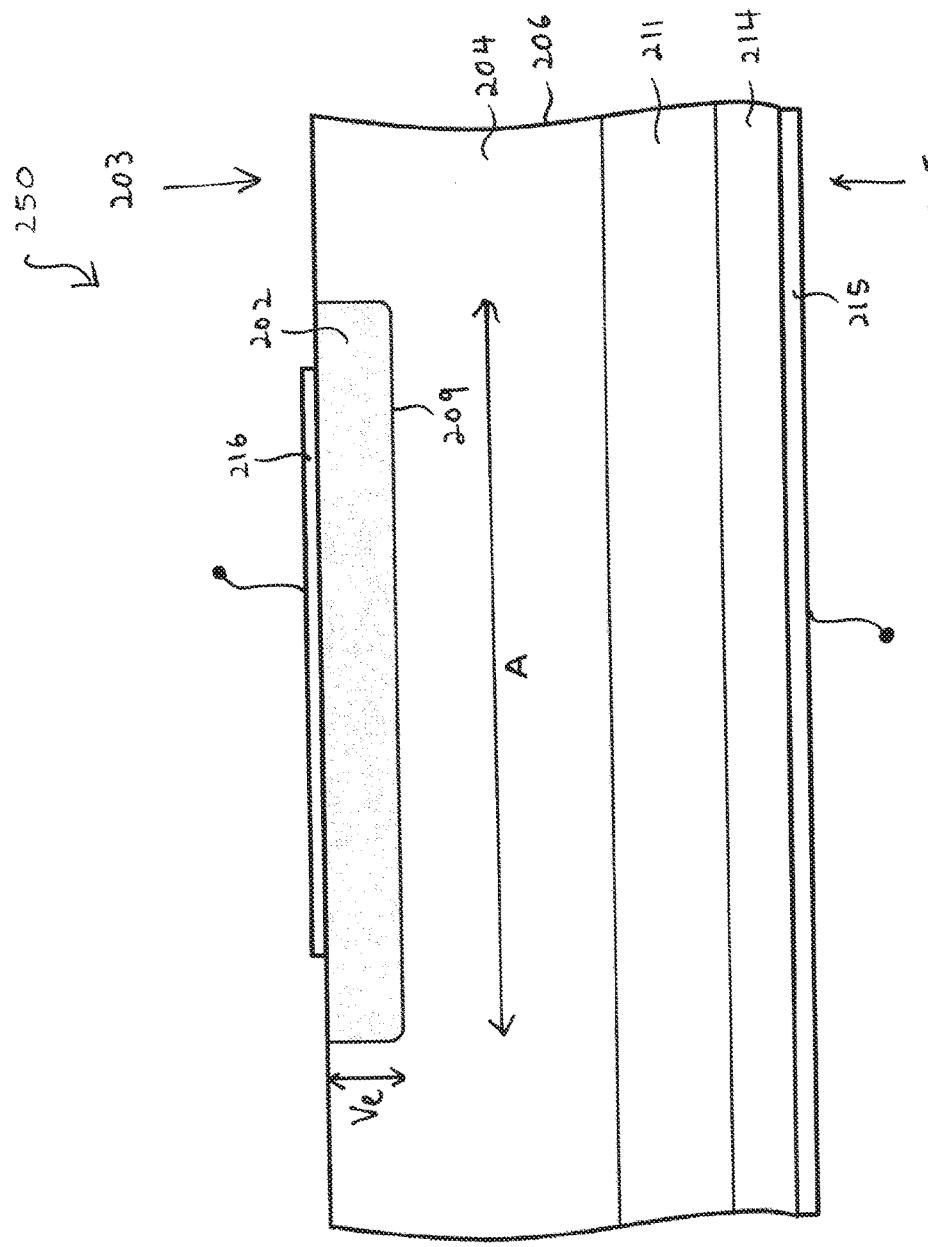

As shown in FIG. 2E, the method 200 may further include forming the back side contact metallization layer 215 (electrode) at the back side 205 of the semiconductor wafer after forming the highly doped region 211 and/or after forming the very highly doped region 214. The back side contact metallization layer 215 may be formed directly adjacent to the very highly doped region 214 of the first cathode or anode doping region if the very highly doped region 214 is present. Since the very highly doped region 214 (e.g. optional flat layer that is highly p doped or $p^+$ type doped using laser thermal annealing) may optionally be omitted, the back side contact metallization layer 215 may be formed directly adjacent to the highly doped region 211 of the first cathode or anode doping region if the very highly doped region 214 of the first cathode or anode doping region is not present.

As shown in FIG. 2E, the method 200 may further include forming the front side contact metallization layer 216 at the front side 203 of the semiconductor wafer 201 after forming the highly doped region 211 of the first cathode or anode doping region and/or after forming the very highly doped region 214 of the first cathode or anode doping region. The front side contact metallization layer 216 (electrode) maybe formed directly adjacent to the at least one second cathode or anode doping region 202, for example.

FIG. 2E shows a cross-sectional schematic illustration of a semiconductor device 250 according to an embodiment which may be formed by the method 200. The semiconductor device 250 may include (or may be) a radiation detector having a p doped field-stop zone 211 produced at relatively low process temperatures, for example.

The semiconductor device 250 may include at least one second cathode or anode doping region 202 having the second conductivity type (e.g. n type doped) located within the semiconductor wafer 201. Optionally or additionally, the second cathode or anode doping region 202 having the second conductivity type may be one of a plurality of second cathode or anode doping regions 202 having the second conductivity type of the semiconductor device. The semiconductor device 250 may further include the lightly doped region 204 (e.g. $p^-$ type doped base zone) and the highly doped region 211 (e.g. a p type doped recrystallized amorphous silicon layer). At least part of the lightly doped region 204 may be located between the second cathode or anode doping region 202 and the highly doped region 211.

A maximal (or largest) lateral width, A. of the second cathode or anode doping region 202 of the plurality of second cathode or anode doping region 202 may lie between 1 µm and 3 µm (or e.g. between 1 µm and 2 µm).

The second cathode or anode doping region 202 may have a vertical extension (e.g. a vertical depth). A minimal (or e.g. smallest) depth of a (or each) second cathode or anode doping region 202 may lie between 0.5% and 50% to (or e.g. between 1% and 30%, or e.g. 2% and 10%) of the thickness of the semiconductor wafer 201 before forming the amorphous semiconductor layer at the back side of the semiconductor wafer 201. The minimal depth, Ve, of the second cathode or anode doping region 202 may be a smallest distance between the front surface of the semiconductor wafer 201 and a bottom of the second cathode or anode doping region 202. Optionally, the minimal depth of the second cathode or anode doping regions 202 may be less than 5 µm (or e.g. between 1 µm and 5 µm, or e.g. between 1 µm and 3 µm), Optionally, the minimal depth, Ve, may be smaller (e.g. at least 10 times smaller) than a maximal width, A, of the second cathode or anode doping region 202. As a non-limiting example, each second cathode or anode doping region 202 may have a lateral surface area of 1 cm² (e.g. having a maximal lateral width, A, of 1 cm and a maximal lateral length, C, of 1 cm in a top view) and may have a minimal depth of 3 μm. Optionally or alternatively, in a side view (or cross-section orthogonal to the lateral length (or the first lateral direction) of the plurality of second cathode or anode doping regions 202, the plurality of second cathode or anode doping regions 202 may have a pillar shape or column shape. As a non-limiting example, the minimal depth of the second cathode or anode doping region 202 may be larger than a maximal width, A, of the second cathode or anode doping region 202. For example, the second cathode or anode doping regions 202 may extend (substantially) vertically into the semiconductor wafer from the front lateral surface of the semiconductor wafer 201 towards the opposite back lateral surface of the semiconductor wafer 201.

The plurality of second cathode or anode doping regions 202 may be formed by a masked implantation with a subsequent in-diffusion of dopants into desired second cathode or anode doping regions 202 to be formed. Optionally, if (n-type) column-shaped second cathode or anode doping regions 202 are desired, multiple epitaxial processes may be carried out. For example, the plurality of column-shaped second cathode or anode doping regions 202 may be formed by repeatedly alternating between forming an epitaxial semiconductor layer at the front side 203 of the semiconductor wafer and incorporating dopants causing the second conductivity type into regions of the epitaxial semiconductor layer for intended second cathode or anode doping regions 202 to be formed from the front side 203 of the semiconductor wafer 201. After forming a plurality of epitaxial semiconductor layer annealing of the plurality of epitaxial semiconductor layers may be carried out to facilitate dopant activation until column shaped second cathode or anode doping regions 202 are formed. Alternatively or optionally, instead of incorporating dopant causing the second conductivity type into each epitaxial layer, the dopants causing the second conductivity type may be incorporated by forming a dopant layer adjacent to an epitaxial layer. The dopant layer may include (or comprise) dopants causing the second conductivity type in dopant regions of the dopant layer. The dopant layer may be arranged adjacent to the epitaxial layer so that the dopant regions comprising the dopants causing the second conductivity type may be adjacent to intended second cathode or anode doping regions 202 to be formed in the epitaxial layer. After annealing the epitaxial layer and the dopant layer, dopants causing the second conductivity type may diffuse from the dopant layer into the epitaxial layer to form at least part of the second cathode or anode doping regions to be formed 202. By repeating the sequential process of forming the epitaxial layer, forming the dopant layer and annealing the epitaxial layer and the dopant layer, a plurality of column shaped second cathode or anode doping regions 202 may be formed. Alternatively or optionally, instead of forming a plurality of epitaxial layers, deep implantation of dopants into the semiconductor wafer 201 may be carried out from the front side 203 of the semiconductor wafer 201 to form the plurality of column-shaped second cathode or anode doping regions 202.

Figure 2F:
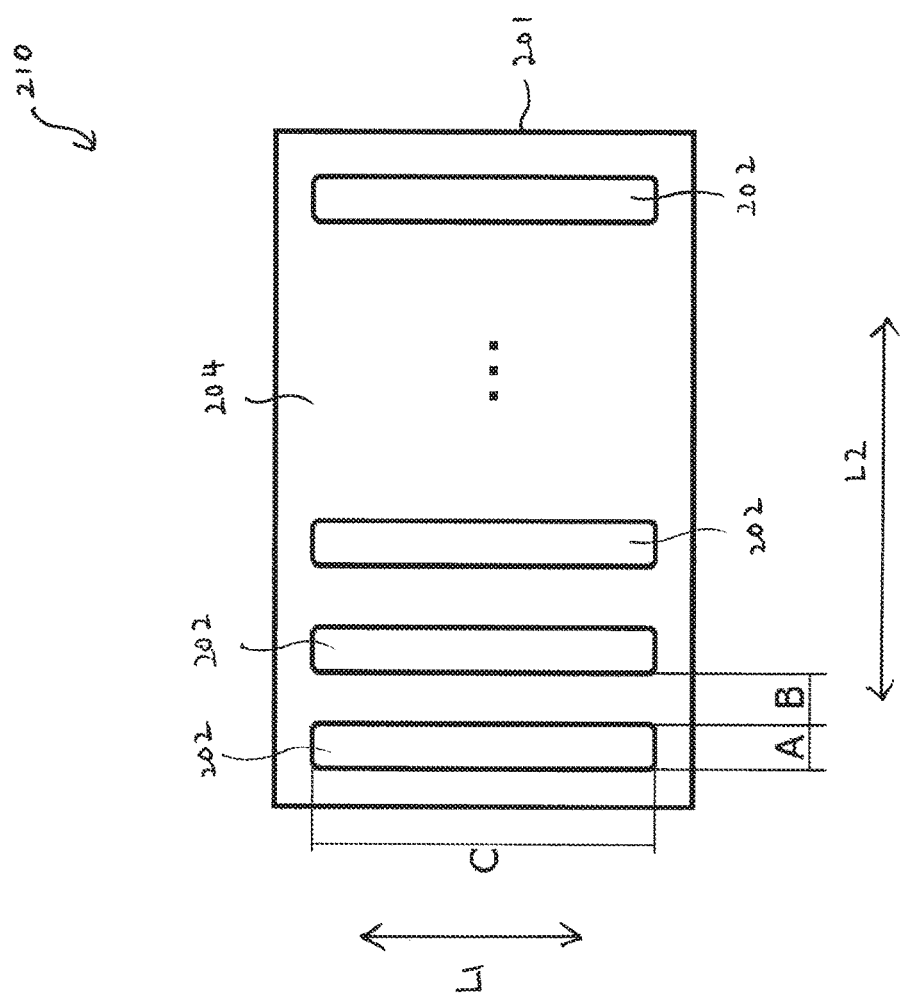

As shown in the top view of FIG. 2F and FIG. 2G, the semiconductor device 210, 220 may include a plurality of second cathode or anode doping regions 202 having the second conductivity type. The method 200 may include forming simultaneously the plurality of second cathode or anode doping regions 202 having the second conductivity type in the semiconductor wafer 201. For example, the plurality of second cathode or anode doping regions 202 may be formed by incorporating dopants causing the second conductivity type into the semiconductor wafer 201 from the front side of the semiconductor wafer 201 through a masking structure. After incorporating the dopants causing the second conductivity type into the semiconductor wafer 202, annealing may be carried out to form the plurality of second cathode or anode doping regions 202. A p-n junction may thus be formed between each second cathode or anode doping region 202 having the second conductivity type and the lightly doped region having the first conductivity type.

FIG. 2F shows a top view of a semiconductor device 210 which may be formed by method 200. As shown in FIG. 2F, portions of the lightly doped region 204 may be located laterally between adjacent second cathode or anode doping regions 202 of the plurality of second cathode or anode doping regions 202. In the top view of the semiconductor device 210, a (or each) second cathode or anode doping region 202 may be striped-shaped and the plurality of second cathode or anode doping regions 202 may be arranged substantially in parallel to each other (e.g. neglecting manufacturing tolerances) in the semiconductor wafer 201. For example, the semiconductor device 210 may be a striped radiation detector comprising an n×1 array of second cathode or anode doping regions 202, where n is an integer greater than 1 (or e.g. n may be an integer between 1 and several thousand, or several hundred).

Optionally, each second cathode or anode doping region 202 of the plurality of second cathode or anode doping regions 202 may comprise a maximal lateral length, C, measured in (or substantially parallel to) a first lateral direction, L1. The maximal (or largest) lateral length, C, of the second cathode or anode doping region 202 may be the lateral length, C, of the second cathode or anode doping region 202 at the front lateral surface of the semiconductor wafer 201. A maximal lateral length C of a second cathode or anode doping region 202 may be more than 10× (or more than 50× or more than 100×) a maximal lateral width A (in the second lateral direction, L2) of the second cathode or anode doping region 202, for example. The maximal (or largest) lateral length, C, of each second cathode or anode doping region 202 may lie between 5 μm and 20 cm (or e.g. between 10 μm and 10 cm, or e.g. between 10 μm and 5 cm), for example. For example, on a 12 inch wafer, 20 cm long strip implants may form the plurality of second cathode or anode doping regions 202.

Each second cathode or anode doping region 202 of the plurality of second cathode or anode doping regions 202 may comprise a maximal (or largest) lateral width, A, measured in (or substantially parallel to) a second lateral direction, L2. The maximal lateral width, A, of the second cathode or anode doping region 202 may be the lateral width, A, of the second cathode or anode doping region 202 at the front lateral surface of the semiconductor wafer 201. The maximal (or largest) lateral width, A of each second cathode or anode doping region 202 of the plurality of second cathode or anode doping region 202 may lie between 5 μm and 20 mm (or e.g. between 10 μm and 10 mm, or e.g. between 10 μm and 5 mm).

A minimum (or e.g. smallest) lateral distance B, measured in (or substantially parallel to) the second lateral direction L2, between neighboring (e.g. directly consecutive, or e.g. laterally adjacent) second cathode or anode doping regions 202 of the plurality of second cathode or anode doping regions 202 may lie between 5 μm and 20 mm (or e.g. between 10 μm and 10 mm, or e.g. between 10 μm and 5 mm), for example. The minimum lateral distance B may be a distance measured in (or substantially parallel to) the second lateral direction L2 at the front lateral surface of the semiconductor wafer 201.

FIG. 2G shows a top view of a semiconductor device 220 which may be formed by method 200. As shown in FIG. 2G, each second cathode or anode doping regions 202 may have a quadratic (e.g. rectangular, or e.g. a square) geometry and may be laterally surrounded (in a top view) on each side by the lightly doped region 204. For example, the semiconductor device to be formed may be a pixel or pad radiation detector comprising a k×j array of second cathode or anode doping regions 202, where k and j are integers greater than 1. For example, k and j may be integers between 1 and several thousand (or e.g. between 1 and several hundred). k may be (but is not limited to being) equal to j.

The plurality of second cathode or anode doping regions 202 formed as shown in FIG. 2G, may differ from the plurality of second cathode or anode doping regions 202 shown in FIG. 2F, in that each second cathode or anode doping region 202 shown in FIG. 2G may comprise a maximal lateral length, C, (in the first lateral direction, L1) of between 0.5 times and 10 times (or e.g. between 0.5 times and 8 times, or e.g. between 0.5 times and 3 times) the maximal lateral width A (in the second lateral direction, L2) of the second cathode or anode doping region 202, for example.

A minimal (or e.g. smallest) lateral distance D, measured in (or substantially parallel to) the first lateral direction L1, between neighboring (e.g. directly consecutive, or e.g. laterally adjacent) second cathode or anode doping regions 202 of the plurality of second cathode or anode doping regions 202 may lie between 5 µm and 20 mm (or e.g. between 10 µm and 10 mm, or e.g. between 10 µm and 5 mm), for example.

More details and aspects are mentioned in connection with the embodiments described above or below. The embodiments shown in FIGS. 2A to 2G may comprise one or more optional additional features corresponding to one or more aspects mentioned in connection with the proposed concept or one or more embodiments described above (e.g. FIGS. 1A to 1B) or below (FIG. 3).

FIG. 3 shows a schematic illustration of a radiation detector 300 according to an example.

The radiation detector 300 comprises a first cathode or anode doping region 321 of a diode structure located at a back side 205 of a semiconductor substrate 301 within the semiconductor substrate 301. The first cathode or anode region 321 has a first conductivity type.

The radiation detector 300 further comprises at least one second cathode or anode doping region 202 of the diode structure located within the semiconductor substrate 301 at a front side 203 of the semiconductor substrate 301. The second cathode or anode region 202 has a second conductivity type.

The first cathode or anode doping region 321 comprises a lightly doped region 204 and a highly doped region 211. At least part of the lightly doped region 204 is located between the second cathode or anode doping region 202 and the highly doped region 211.

A doping concentration of the lightly doped region 204 is in a range between $1*10^{11}$ dopants per $cm^3$ and $1*10^{14}$ dopants per $cm^3$.

A maximal vertical dimension, vl, of the lightly doped region between the second cathode or anode doping region 202 and the highly doped region 211 is in a range between 10 µm and 600 µm.

A doping concentration of the highly doped region is in a range between $1*10^{14}$ dopants per $cm^3$ and $1*10^{17}$ dopants per $cm^3$.

A maximal vertical dimension, vh, of the highly doped region is in a range between 100 nm and 30 µm.

Due to the presence of the highly doped region having a doping concentration between $1*10^{14}$ dopants per $cm^3$ and $1*10^{17}$ dopants per $cm^3$, and due to the highly doped region having a maximal vertical dimension of between 100 nm and 30 µm, the highly doped region may be effective as a field stop region of a diode structure, and/or may prevent a space charge region from bordering (or extending or reaching) into a back side contact metallization layer of the semiconductor device 300. The formed highly doped region may avoid a reduced breakdown voltage and/or an increased leakage current of the semiconductor device 300, for example.

The lightly doped region having the first conductivity type (e.g. p⁻ type doping) may have an average net doping concentration of between $1*10^{11}$ dopants per $cm^3$ and $1*10^{14}$ dopants per $cm^3$ (or e.g. between $5*10^{11}$ dopants per $cm^3$ and $1*10^{14}$ dopants per $cm^3$ or e.g. between $1*10^{12}$ dopants per $cm^3$ and $1*10^{13}$ dopants per $cm^3$).

An average doping concentration of the highly doped region having the first conductivity type (e.g. p type doping) may be least $1*10^{14}$ dopants per $cm^3$ (or e.g. between $1*10^{14}$ dopants per $cm^3$ and $1*10^{17}$ dopants per $cm^3$, or e.g. between $1*10^{14}$ dopants per $cm^3$ and $1*10^{16}$ dopants per $cm^3$, or e.g. between $3*10^{14}$ dopants per $cm^3$ and $1*10^{16}$ dopants per $cm^3$).

The first cathode or anode doping region 321 may further include a very highly doped region 214 (shown in FIG. 2E) located between the highly doped region 211 and a contact metallization layer 215 located at a back side 205 of the semiconductor substrate 301 (shown in FIG. 2E).

An average doping concentration of the very highly doped region having the first conductivity type (e.g. p⁺ type doping) after annealing at least part of the monocrystalline semiconductor may be at least $1*10^{16}$ dopants per $cm^3$ (or e.g. between $1*10^{16}$ dopants per $cm^3$ and $1*10^{20}$ dopants per $cm^3$, or e.g. between $1*10^{16}$ dopants per $cm^3$ and $1*10^{18}$ dopants per $cm^3$).

An average doping concentration of the second cathode or anode doping region having the second conductivity type (e.g. n⁺) after annealing the semiconductor wafer may be at least $1*10^{16}$ dopants per $cm^3$ (or e.g. between $1*10^{16}$ dopants per $cm^3$ and $1*10^{20}$ dopants per $cm^3$, or e.g. between $1*10^{16}$ dopants per $cm^3$ and $1*10^{18}$ dopants per $cm^3$.

A maximal (or largest) vertical dimension, vl, of the lightly doped region between the second cathode or anode doping region 202 and the highly doped region 211 may lie between 10 µm and 600 µm (or e.g. between 50 µm and 500 µm, or e.g. between 50 µm and 200 µm).

A maximal (or largest) vertical dimension, vh, of the highly doped region may lie between 100 nm and 30 µm (or e.g. between 70 nm and 10 µm, or e.g. between 200 nm and 10 µm, or e.g. between 100 nm and 3 µm, or e.g. between 500 nm and 5 µm).

A maximal (or largest) vertical dimension of the very highly doped region may be less than 1 µm (or e.g. less than 800 nm, or e.g. less than 600 nm).

A maximal (or largest) total thickness, vt, of the semiconductor device between a front side metallization layer and a back side metallization layer may be less than 500 µm (or e.g. between 200 µm and 300 µm).

A minimal (or smallest) lateral dimension (e.g. a diameter) of the semiconductor substrate may be larger than 4 inches (10.16 cm), or e.g. larger than 8 inches (20.32 cm), or e.g. larger than 12 inches (30.48 cm).

The semiconductor devices described herein provide concepts for a radiation-hardened and thin detector device having good voltage sustaining capability. With regard to radiation detectors, due to the constant irradiation with high-energy particles, vacancies may be generated during operation of the devices that congregate into acceptor-type complexes. Diode structures having a p doped base zone may experience a change in doping concentration (e.g. towards higher values), however the conductivity type remains unchanged. In contrast, if n doped base zones are used, doping reversal may occur in the course of operating life of the detectors, resulting in the edge terminal of the device becoming ineffective and in the blocking capability of these devices suddenly degrading.

The various examples described herein provide concepts for manufacturing radiation detectors having a p doped base zone and a flat backside emitter, and achieving a targeted blocking capability. The various examples thus provide a p-region sufficiently extended in vertical direction and also sufficiently highly doped over the whole lateral extension of the device, that may be effective as a field-stop zone and may prevent the space-charge region from bordering on the backside metallization and/or on possibly existing backside spikes, and thus avoids a reduced breakdown voltage and an increased leakage current.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1A to 2G) or below.

Some embodiments relate to a radiation detector with a p doped field stop zone. For example, the examples described herein may provide a suitable backside structure for 8" devices in case of a p doped base zone of the diode. The various examples facilitate a highly p doped layer on the back of large-area discs for the manufacture of radiation detectors at the lowest possible process temperatures, for example. The examples may satisfy a demand to provide concepts for reliably forming (or manufacturing) a semiconductor device such as a radiation detector, and/or to provide concepts for a radiation detector having a high breakdown voltage and/or reduced leakage current.

The aspects and features (e.g. amorphous semiconductor layer, the lightly doped region, highly doped region, the very highly doped region, the semiconductor wafer, the dopants, the back side contact metallization layer, the front side contact metallization layer, the monocrystalline layer, the semiconductor device, the radiation detector, the forming of the amorphous semiconductor layer, the incorporating of dopants into the amorphous semiconductor layer, the annealing of the amorphous semiconductor layer) mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes. -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming a semiconductor device, the method comprising:
   providing a semiconductor wafer having a lightly doped region that extends to a back side of the wafer, the lightly doped region having a first conductivity type;
   forming an amorphous semiconductor layer at the back side of the wafer such that the amorphous semiconductor layer extends from the back side and forms a direct interface with the lightly doped region at a location that is spaced apart from the back side;
   incorporating first conductivity type dopants into the amorphous semiconductor layer during or after forming the amorphous semiconductor layer; and
   annealing the amorphous semiconductor layer to transform at least a part of the amorphous semiconductor layer into a substantially monocrystalline semiconductor layer and to form a highly doped region in the monocrystalline semiconductor layer at the back side of the semiconductor wafer, wherein the highly doped region directly adjoins the lightly doped region at the direct interface and has the first conductivity type.

2. The method of claim 1, wherein the dopants incorporated into the amorphous semiconductor layer are boron, difluoroboron, aluminum, nitrogen, gallium or indium dopants.

3. The method of claim 1, wherein the dopants are incorporated into the amorphous semiconductor layer such that a doping concentration of the highly doped region after annealing the amorphous semiconductor layer is at least $1*10^{14}$ dopants per $cm^3$.

4. The method of claim 1, further comprising exposing the amorphous semiconductor layer to a hydrogen plasma during or after annealing the amorphous semiconductor layer.

5. The method of claim 1, wherein the lightly doped region and the highly doped region form at least part of a first cathode or anode doping region of a diode structure of the semiconductor device.

6. The method of claim 5, further comprising forming at least one second cathode or anode doping region of the diode structure having a second conductivity type in the semiconductor wafer,
   wherein the second cathode or anode region forms at least part of a front side of the semiconductor wafer, and
   wherein a p-n junction is formed between the at least one second cathode or anode doping region and the lightly doped region.

7. The method of claim 1, further comprising forming a plurality of cathode or anode doping regions having a second conductivity type in the semiconductor wafer,
   wherein portions of the lightly doped region are located laterally between adjacent cathode or anode doping regions of the plurality of cathode or anode doping regions.

8. The method of claim 1, wherein annealing the amorphous semiconductor layer comprises heating the amorphous semiconductor layer at a temperature of less than 550° C.

9. The method of claim 1, wherein annealing the amorphous semiconductor layer comprises irradiating the amorphous semiconductor layer with microwaves.

10. The method of claim 1, further comprising incorporating dopants into the lightly doped region from the back side of the semiconductor wafer before forming the amorphous semiconductor layer adjacent to the lightly doped region of the semiconductor wafer.

11. The method of claim 1, further comprising:
    forming a plurality of amorphous semiconductor layers and incorporating dopants into the plurality of amorphous semiconductor layers, to form a plurality of amorphous semiconductor layers comprising the incorporated dopants; and
    annealing the plurality of amorphous semiconductor layers comprising the incorporated dopants to transform at least a part of the plurality of amorphous semiconductor layers into the substantially monocrystalline semiconductor layer and to form the highly doped region in the monocrystalline semiconductor layer.

12. The method of claim 11, wherein annealing the plurality of amorphous semiconductor layers comprises an oven heating process or laser thermal annealing at a temperature of less than 550° C. after forming the plurality of amorphous semiconductor layers comprising the incorporated dopants.

13. The method of claim 11, wherein each amorphous semiconductor layer of the plurality of amorphous semiconductor layers is individually annealed by laser thermal annealing for at least one annealing time interval, wherein the laser thermal annealing is controlled so that a temperature at a front side of the semiconductor wafer remains below 420° C. during the laser thermal annealing.

14. The method of claim 1, further comprising:
    incorporating dopants into the monocrystalline semiconductor layer after forming the highly doped region in the monocrystalline semiconductor layer; and
    annealing at least part of the monocrystalline semiconductor by laser thermal annealing to form a very highly doped region having the first conductivity type in the monocrystalline semiconductor layer.

15. The method of claim 14, wherein an annealing depth caused by the laser thermal annealing is less than 1μm.

16. The method of claim 14, wherein the dopants are incorporated into the monocrystalline semiconductor such that a doping concentration of the very highly doped region after annealing at least part of the monocrystalline semiconductor is at least $1*10^{16}$ dopants per $cm^3$.

17. The method of claim 1, further comprising forming a contact metallization layer at the back side of the semiconductor wafer after forming the highly doped region.

18. A method for forming a semiconductor device, the method comprising:
    providing a semiconductor wafer having a lightly doped region that extends to a back side of the wafer, the lightly doped region having a first conductivity type;
    forming a polycrystalline semiconductor layer at the back side of the wafer such that the polycrystalline semiconductor layer extends from the back side and forms a direct interface with the lightly doped region at a location that is spaced apart from the back side;

incorporating first conductivity type dopants into the polycrystalline semiconductor layer during or after forming the polycrystalline semiconductor layer; and annealing the polycrystalline semiconductor layer to transform at least a part of the polycrystalline semiconductor layer into a substantially monocrystalline semiconductor layer and to form a highly doped region in the monocrystalline semiconductor layer at the back side of the semiconductor wafer, wherein the highly doped region has the first conductivity type, wherein the highly doped region directly adjoins the lightly doped region at the direct interface and has the first conductivity type.

* * * * *